United States Patent
Holesinger et al.

(10) Patent No.: US 6,843,898 B2
(45) Date of Patent: Jan. 18, 2005

(54) HIGH TEMPERATURE SUPERCONDUCTING COMPOSITE CONDUCTORS

(75) Inventors: Terry G. Holesinger, Los Alamos, NM (US); Stephen R. Foltyn, Los Alamos, NM (US); Paul N. Arendt, Los Alamos, NM (US); James R. Groves, Los Alamos, NM (US); Quanxi Jia, Los Alamos, NM (US); Alicia Ayala, Santa Fe, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/819,530

(22) Filed: Apr. 6, 2004

(65) Prior Publication Data

US 2004/0192560 A1 Sep. 30, 2004

Related U.S. Application Data

(62) Division of application No. 10/113,475, filed on Mar. 28, 2002, now Pat. No. 6,716,545.
(60) Provisional application No. 60/333,917, filed on Nov. 21, 2001.

(51) Int. Cl.$^7$ .................. C23C 14/00; C25B 11/00; C25B 13/00; C25B 9/00
(52) U.S. Cl. ............... 204/298.13; 204/192.24; 428/697; 428/702; 501/108
(58) Field of Search .............. 204/192.24, 192.23, 204/298.12, 298.13; 428/697, 702; 501/108, 121

(56) References Cited

U.S. PATENT DOCUMENTS

| | | | | |
|---|---|---|---|---|
| 4,920,094 A | * | 4/1990 | Nogawa et al. | 505/475 |
| 5,814,583 A | * | 9/1998 | Itozaki et al. | 505/237 |
| 5,820,994 A | * | 10/1998 | Gotoh et al. | 428/451 |
| 6,121,630 A | * | 9/2000 | Itozaki et al. | 257/33 |
| 6,139,701 A | * | 10/2000 | Pavate et al. | 204/192.17 |
| 6,617,056 B1 | * | 9/2003 | Hara et al. | 428/697 |
| 6,716,545 B1 | * | 4/2004 | Holesinger et al. | 428/701 |

\* cited by examiner

*Primary Examiner*—Colleen P. Cooke
(74) *Attorney, Agent, or Firm*—Bruce H. Cottrell

(57) ABSTRACT

Copper or excess copper is added to one or more layers of a superconducting composite structure to reduce migration of copper form a copper based superconducting layer.

4 Claims, No Drawings

HIGH TEMPERATURE SUPERCONDUCTING COMPOSITE CONDUCTORS

This application claims the benefit of provisional application Ser. No. 60/333,917 filed Nov. 21, 2001.

This application is a divisional of Ser. No. 10/113,475, filed on Mar. 28, 2002, now U.S. Pat. No. 6,716,545.

This invention is the result of a contract with the United States Department of Energy (Contract No. W-7405-ENG-36).

FIELD OF THE INVENTION

The present invention relates to high temperature superconductors (HTS) and to their use.

BACKGROUND OF THE INVENTION

One process in the production of coated conductors (superconductive tapes or films) has been referred to as a thick film process where the thickness of the superconductive layer is generally at least one micron in thickness. In the thick film process, it has been shown that YBCO thin films on single crystal substrates can achieve critical current density ($J_c$) values of over $10^6$ amperes per square centimeter ($A/cm^2$) at 77 K. For non-epitaxial or amorphous substrates, the use of a suitable buffer layer to provide the necessary structural template has been previously developed.

One method of producing the coated conductor has been to deposit a textured film of a suitable buffer material onto a random, polycrystalline metal substrate. To obtain the best results, the textured film is deposited upon the metal substrate by ion-beam-assisted deposition. The preferred material for deposition by IBAD is magnesium oxide (MgO). IBAD MgO is an attractive process for making a textured film on a polycrystalline substrate because it is relatively fast and, hence, commercially feasible to scale into an industrial production process. The use of MgO has replaced the use of yttria-stabilized zirconia (YSZ). YSZ was the first material to be successfully deposited via IBAD to obtain a good textured film on which high quality $YBa_2Cu_3O_y$ (YBCO) was deposited with a high critical current density ($J_c$) and high critical current ($I_c$). The use of MgO rather than YSZ speeds up the process of forming a similar quality film by as much as 100 times. One reason that limited the move to the use of a MgO layer was difficulties with materials compatibility, i.e.; MgO tended to react with other materials in the various layers. For example, while IBAD YSZ layers were largely unreactive with the subsequently deposited superconducting films, MgO films have been found to react with a YBCO layer.

Thus, further improvements in the coated conductors have been desired. After extensive and careful investigation, improvements have been found to the preparation of superconducting films on polycrystalline substrates such as flexible polycrystalline metal substrates with an IBAD MgO layer.

SUMMARY OF THE INVENTION

To achieve the foregoing and other objects, and in accordance with the purposes of the present invention, as embodied and broadly described herein, the present invention provides a composite target material suitable for ablative deposition of a Cu-containing MgO layer upon a target substrate, said composite target material comprising: an intimate blend of MgO and CuO, said ratio of CuO:MgO being from about 0.01:100 to about 15:100 by weight.

In another embodiment, the present invention provides a composite target material suitable for ablative deposition of a Cu-containing $(Sr_{1-x-y}Ba_xCa_y)TiO_3$ layer upon a target substrate comprising: an intimate blend of CuO, $TiO_2$, and one or more oxides selected from the group consisting of SrO, BaO and CaO, said ratio of CuO:SrO, BaO and CaO and $TiO_2$ being from about 0.01:100 to about 15:100 by mole percent.

In another embodiment, the present invention provides a superconducting structure comprising: a substrate, at least one intermediate layer upon said substrate, and a copper-containing superconducting layer upon at least one intermediate layer, wherein at least one intermediate layer is formed from a copper-containing composite target material whereby said copper within said intermediate layer does not adversely affect intermediate layer structure while reducing migration of copper from said copper-containing superconducting layer into said intermediate layer.

In another embodiment, the present invention provides a superconducting structure comprising: a substrate, at least one intermediate layer upon said substrate, and a superconducting layer of YBCO upon said at least one intermediate layer, wherein said superconducting layer includes excess copper whereby loss of copper from said superconducting layer to said at least one intermediate layer does not lead to a copper deficient superconducting layer with diminished superconducting properties.

DETAILED DESCRIPTION

The present invention is concerned with high temperature superconducting composites. Specifically, the present invention is concerned with the addition of copper or excess copper to one or more of the layers of a superconducting composite structure to maintain high performance of a copper based superconducting layer. While not wishing to be bound by the present explanation, it is believed that through addition of copper or excess copper to one or more of the layers of a superconducting composite, the copper content of the copper based superconducting layer can be maintained at more optimal levels. Addition of excess copper to a copper based superconducting layer can allow for loss of some copper from the superconducting layer to other layers of the superconducting composite without significant degradation of the superconducting properties. Addition of copper to one of the various template and buffer layers found within superconducting composites, such layers typically formed from copper-free targets, can reduce the tendency for copper to migrate from the superconducting layer into these other template and buffer layers and avoid significant degradation of the superconducting properties.

A MgO layer in a superconducting composite does significantly react with a nearby YBCO layer. Both $Cu^+$ and $Cu^{2+}$ ions are able to substitute into a MgO-rich solid solution. There is also an intermediate compound, $Cu_2MgO_3$ that can form. The typical architecture of an IBAD MgO coated conductor includes a number of template and buffer layers. It has been found that copper from the final layer in these composite structures, the YBCO superconducting layer, can diffuse into or through the various buffer and template layers and reach the MgO layer whereat substitution can occur. Copper depletion in the YBCO layer has adverse effects on phase development and ultimate superconducting properties. One approach to this problem is to add excess copper to the system to make up for any deficiencies that may arise in the copper-based superconducting film. Copper can be added in at least three differing manners. First, copper can be added directly to the MgO layer. Second, copper can be added into intervening buffer layers, e.g., a strontium titanate buffer layer. Third, copper, as excess copper from the required stoichiometric copper content, can be added directly to the YBCO, i.e., the copper-based superconducting film, to compensate for any loss during processing. Additionally, combinations of these three manners can be employed.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, variations of this basic superconducting material, such as use of other rare earth metals as a substitute for some or all of the yttrium as is well known, may also be used. Other superconducting materials such as bismuth and thallium based superconductor materials may also be employed. $YBa_2Cu_3O_{7-\delta}$ is preferred as the superconducting material.

In the present invention, the initial or base substrate can be, e.g., any polycrystalline material such as a metal or a ceramic such as polycrystalline aluminum oxide or polycrystalline zirconium oxide. Preferably, the substrate can be a polycrystalline metal such as nickel. Alloys including nickel such as various Hastalloy metals, Haynes metals and Inconel metals are also useful as the substrate. The metal substrate on which the superconducting material is eventually deposited should preferably allow for the resultant article to be flexible whereby superconducting articles (e.g., coils, motors or magnets) can be shaped. As such a metal substrate can have a rough surface, it can be mechanically polished to provide a smoother surface. Alternatively, the desired smoothness for subsequent depositions can be provided by the first coating layer, i.e., an inert oxide material layer.

It can be generally preferred to use aluminum-containing metals as the metal substrate, such aluminum-containing metals including at least about 3 atomic percent aluminum. Metal substrates containing aluminum have been found to achieve superior results in the final superconducting article. Preferably, the aluminum-containing metal substrate contains at least about 30 atomic percent aluminum. Among the suitable aluminum-containing alloys are included an alloy of about 50 atomic percent aluminum and about 50 atomic percent nickel and an alloy of about 30 atomic percent aluminum and about 70 atomic percent nickel. Alloys of iron/aluminum such as 40 atomic percent aluminum/60 atomic percent iron or of silver/aluminum such as 15 atomic percent aluminum/85 atomic percent silver can also be used. Other additives may be added to the aluminum-containing metal substrates as desired to improve other known properties of the metal.

Initially, a magnesium oxide (MgO) layer is preferable deposited upon the base substrate. Such a MgO layer is preferably deposited by ion beam assisted deposition. The MgO layer in the ion beam assisted deposition is typically sputtered from a polycrystalline ceramic magnesia target. An ion-assisted, electron-beam evaporation system similar to that described by Wang et al., App. Phys. Lett., vol. 71, no. 20, pp. 2955–2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 54.7±3°.

The ion source gas in the ion beam assisted deposition includes at least some light ions such as neon or helium. More preferably, the ion source gas generally includes up to about 90 percent by volume of the light ions such as neon or helium with the remainder being xenon, krypton, or argon, preferably argon, to facilitate maintaining the plasma. Higher amounts of the light ions may be used so long as the plasma can be maintained. Use of about 90 percent by volume of the light ions contributes to a more textured MgO layer generally yielding an improvement in current carrying properties. The ion beam assisted deposition of MgO is conducted with substrate temperatures of generally from about 20° C. to about 250° C. The MgO layer deposited by the IBAD process is generally from about 2 nm to about 20 nm in thickness, preferably about 2 nm to about 15 nm.

A thin film template structure is provided in accordance with the present invention and includes a substrate, a layer of an oriented cubic oxide material having a rock-salt-like structure upon the amorphous oxide material layer. Such a thin film template structure is useful for subsequent deposition of epitaxial thin films. Such epitaxial thin films can be formed from a material selected from the group consisting of superconductors, including high temperature superconductors, semiconductors, photovoltaic materials, magnetic materials, and precursors of superconductors or high temperature superconductors. The thin film template structure is especially preferred for subsequent deposition of high temperature superconductor materials. Depending upon the particular epitaxial thin film material deposited upon the thin film template structure, additional layers such as buffer layers can be employed for enhanced chemical or structural compatibility. In the case of YBCO as a high temperature superconductor, buffer layers are generally employed.

In one embodiment of the present invention, one or more intermediate layers are deposited onto the MgO layer so that they are between the MgO layer deposited by the IBAD process and the superconducting YBCO layer. The one or more intermediate layers serve as buffer layers between the MgO layer and the YBCO and assists in lattice matching. This so-called "buffer layer" should have good "structural compatibility" between the MgO or other oriented cubic oxide material deposited in the IBAD process and the YBCO and should have good chemical compatibility with both adjacent layers. By "chemical compatibility" is meant that the intermediate layer does not undergo property-degrading chemical interactions with the adjacent layers. By "structural compatibility" is meant that the intermediate layer has a substantially similar lattice structure with the superconductive material. Among the materials suitable as this intermediate buffer layer are cerium oxide, yttria-stabilized zirconia, yttrium oxide, strontium titanate and other cubic oxide materials such as those described in U.S. Pat. No. 5,262,394, by Wu et al. for "Superconductive Articles Including Cerium Oxide Layer" such description hereby incorporated by reference. In a preferred embodiment, the present invention includes a layer of yttria-stabilized zirconia or strontium titanate on the MgO layer and a layer of cerium oxide on the layer of yttria-stabilized zirconia. The layer of yttria-stabilized zirconia or strontium titanate is generally from about 50 nm to about 1000 nm in thickness, preferably from about 100 nm to about 500 nm in thickness. The layer of cerium oxide is generally from about 5 nm to about 200 nm in thickness, preferably from about 10 nm to about 40 nm in thickness.

The intermediate or buffer layers are generally deposited at temperatures of greater than about 700° C., preferably at temperatures of from about 775° C. to about 800° C. Raising the deposition temperature of this layer has been found to promote the greatest reduction in degrees of full-width-half maxima (FWHM) in the x-ray phi scan of the YBCO as compared to the x-ray phi scan of the IBAD-MgO.

The HTS layer, e.g., the YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

In pulsed laser deposition, powder of the material to be deposited can be initially pressed into a disk or pellet under high pressure, generally above about 500 pounds per square inch (PSI) and the pressed disk then sintered in an oxygen atmosphere or an oxygen-containing atmosphere at temperatures of about 950° C. for at least about 1 hour, preferably from about 12 to about 24 hours. One common approach to preparing a target for pulsed laser deposition can involve grinding of the target materials and followed by sintering of the powder in, e.g., air, for from one half day up to five days at temperatures of front about 800° C. to about 1000° C. Several repeated grinding and sintering cycles can assure a well-mixed sample. Then, the materials can be pressed to complete the desired target. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

In the present invention, one suitable composite target material for ablative deposition of a Cu-containing MgO layer upon a target substrate can include an intimate blend of MgO and CuO in a ratio of CuO:MgO of from about 0.01:100 to about 15:100 by weight, more preferably from about 0.05:100 to about 10:100 by weight, and most preferably from about 0.1:100 to about 5:100 by weight.

Further in the present invention, one suitable composite target material for ablative deposition of a Cu-containing $(Sr_{1-x-y}Ba_xCa_y)TiO_3$ layer upon a target substrate can include an intimate blend of CuO, $TiO_2$, and one or more oxides selected from the group consisting of SrO, BaO and CaO in a ratio of CuO:SrO, BaO and CaO and $TiO_2$ being from about 0.01:100 to about 15:100 by weight, more preferably from about 0.05:100 to about 10:100 by weight, and most preferably from about 0.1:100 to about 5:100 by weight. The strontium, barium and calcium content of the alkaline earth titanate material is present at the same mole content as the titanium, i.e., there is one strontium, barium or calcium atom per titanium atom.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The target substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

In an embodiment of the present invention, a nickel alloy substrate is initially coated with a layer of MgO (about 100 Å) by ion beam assisted deposition. Other layers may optionally be deposited intermediate to the nickel alloy substrate and the MgO layer. For example, a first layer of a material such as aluminum oxide or erbium oxide and a second layer of a material such as yttrium oxide or aluminum oxynitride can be deposited in the manner described by Jia et al., in U.S. patent application Ser. No. 09/731,534, for "High Temperature Superconducting Thick Films", filed on Dec. 6, 2000. Optionally, a homoepitaxial layer of MgO can be deposited upon the IBAD-MgO layer, the homoepitaxial layer of MgO of about 1000 Å in thickness deposited in a hot process such as pulsed laser deposition. Then, a first buffer layer of YSZ of from about 500 Å to about 10,000 Å in thickness is deposited on the MgO layer. Then a second buffer layer of cerium oxide of from about 50 Å to about 400 Å in thickness is deposited on the YSZ layer. Finally, a layer of YBCO is deposited, e.g., by pulsed laser deposition at a thickness of, e.g., about 10,000 Å to 20,000 Å. The copper or excess copper is then added as desired to one or more of these layers.

The present invention is more particularly described in the following examples which are intended as illustrative only, since numerous modifications and variations will be apparent to those skilled in the art.

EXAMPLE 1

A pair of IBAD MgO samples was prepared identically using mechanically polished Inconel 625 with a $Y_2O_3$ nucleation layer. After MgO deposition, both samples were coated with a YSZ layer (from about 0.5 to about 1.0 microns) and a $CeO_2$ layer (about 50 nm) in a single pulsed laser deposition run. One of the samples was coated with a standard of $Y_1Ba_2Cu_3O_{7-x}$, while the other was coated in the same manner except with a different target having the composition $Y_1Ba_2Cu_{3.3}O_{7-x}$ (i.e., 10 percent excess copper content from the standard). Each YBCO coating was about 0.5 micron thick. Critical current densities were measured on the sample. The control sample with the standard YBCO composition had a $J_c=32$ $kA/cm^2$ and the coating with the excess copper or copper-rich composition had a $J_c=140$ $kA/cm^2$. From these results it was concluded that formation of a copper rich YBCO layer enhanced the critical current density by preventing the final YBCO layer from being copper deficient through loss of copper to other layers in the composite structure.

EXAMPLE 2

A MgO-5 weight percent CuO material was used as the deposition material for deposition by IBAD of a textured template on a polycrystalline Ni-alloy substrate. A similar film was made with standard pure MgO. Comparison of resultant reflection high energy electron diffraction (RHEED) images for the Cu-doped MgO layer and the standard undoped MgO layer showed a similar pattern. In-plane texture for the two films was of similar value. From these results it was concluded that addition of minor amounts of copper to the MgO layer does not adversely affect the structure of that layer, but should reduce the migration of copper from a nearby YBCO layer into the MgO layer thereby reducing degradation of the YBCO layer superconducting properties.

EXAMPLE 3

In another run, MgO-5 weight percent CuO material was used as the deposition material for deposition by IBAD of a textured template of a thickness of about 100 Angstroms on a polycrystalline Ni-alloy substrate. Onto this was deposited additional MgO-5 weight percent CuO material by pulsed laser deposition. A two-theta x-ray scan from 20 to 100 degrees revealed 5 peaks: (200) and (400) of MgO and peaks at 50.56, 74.4 and 90.3 which were attributed to the substrate. Hence, the IBAD and PLD layers of MgO-5 weight percent CuO material were found to be epitaxial which is the condition necessary for further processing of an optimal superconductor composite.

EXAMPLE 4

Copper substitution into strontium titanate was examined. The system $SrO-CuO-TiO_2$ was examined. Bulk studies indicated that at least 2.5 molar percent copper and possibly 5 molar percent copper could substitute into this phase. A bulk target was formed with a composition of $Sr_1Cu_{0.1}Ti_{0.9}O_y$. X-ray diffraction studies on a powder of this composition processed at 1000° C. in oxygen for 70 hours showed single phase STO. The target was ground, pressed into a 2-inch target, and heat-treated in oxygen at 1000° C. for 25 hours. It was then used as a buffer material on an IBAD MgO coated polycrystalline nickel alloy substrate. The IBAD-MgO/Ni alloy substrate used in this run had an in-plane texture spread of about 13°. The copper-doped strontium titanate (STO) was deposited on this sample at 775° C. by PLD at a laser repetition rate of 10 Hz. Oxygen background pressure was maintained in the system during deposition at about 200 milliTorr (mT) and the deposition time was about 10 minutes. A $Y_1Ba_2Cu_3O_{7-x}$ film was then deposited on the STO buffer at 775° C. by PLD under 200 mT of $O_2$ over about 8 minutes. The resulting superconducting film had a thickness of about 0.6 microns with a $T_c$ of 87K. The $J_c$ was measured as 0.645 megamperes per square centimeter ($MA/cm^2$). From these results it was concluded that use of a copper rich buffer layer enhanced the critical current density of the final YBCO layer by reducing the migration of copper from the YBCO layer into other layers in the composite structure.

The approaches demonstrated in the examples can be used singly for the fabrication of the superconducting composites or in combination. The copper-doped buffer layers and or copper-rich YBCO can be used with other template systems other than ion beam assisted deposition based templates. Each approach serves to suppress the detrimental aspects of copper loss from the YBCO layer or other copper based high temperature superconducting layers. It has also been found that copper-doped targets used for PLD tend to be darker and more opaque compared to pure MgO or STO targets. This contributes to an improved PLD process in that such a process is more efficient in ablation of material from the targets leading to faster deposition times.

Although the present invention has been described with reference to specific details, it is not intended that such details should be regarded as limitations upon the scope of the invention, except as and to the extent that they are included in the accompanying claims.

What is claimed is:

1. A composite target material suitable for ablative deposition of a Cu-containing MgO layer upon a target substrate, said composite target material comprising: an intimate blend of MgO and CuO, said ratio of CuO:MgO being from about 0.01:100 to about 15:100 by weight.

2. The composite target material of claim 1 wherein said ratio is from about 0.05:100 to about 10:100 by weight.

3. The composite target material of claim 1 wherein said ratio is from about 0.1:100 to about 5:100 by weight.

4. The composite target material of claim 1 wherein said ratio is about 5:100 by weight.

* * * * *